(12) United States Patent
Park et al.

(10) Patent No.: US 12,527,212 B2
(45) Date of Patent: Jan. 13, 2026

(54) DISPLAY APPARATUS AND METHOD OF MANUFACTURING THE SAME

(71) Applicant: SAMSUNG DISPLAY CO., LTD., Yongin-si (KR)

(72) Inventors: Miyoung Park, Yongin-si (KR); Taeeun Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 332 days.

(21) Appl. No.: 18/199,027

(22) Filed: May 18, 2023

(65) Prior Publication Data
US 2024/0040915 A1 Feb. 1, 2024

(30) Foreign Application Priority Data
Jul. 28, 2022 (KR) .................. 10-2022-0094028

(51) Int. Cl.
*H10K 59/80* (2023.01)
*H10K 59/12* (2023.01)

(52) U.S. Cl.
CPC ..... *H10K 59/8791* (2023.02); *H10K 59/1201* (2023.02); *H10K 59/872* (2023.02)

(58) Field of Classification Search
CPC ........... H10K 59/8791; H10K 59/1201; H10K 59/872; H10K 59/871; H10K 59/8794; H10K 59/80; H10K 59/12; H10K 71/00; H10K 50/841; H10K 50/86; H10K 59/65; H01L 23/60; H10H 20/01; H10H 20/85; H10H 29/142

See application file for complete search history.

(56) References Cited

U.S. PATENT DOCUMENTS

| | | |
|---|---|---|
| 2004/0239729 A1 | 12/2004 | Kim et al. |
| 2009/0310055 A1 | 12/2009 | Kim et al. |
| 2021/0074789 A1 | 3/2021 | Hwang |
| 2024/0306469 A1* | 9/2024 | Zhou ............... H10K 59/00 |

FOREIGN PATENT DOCUMENTS

| | | |
|---|---|---|
| KR | 1020040101862 A | 12/2004 |
| KR | 10220080088138 A | 10/2008 |
| KR | 101306136 B1 | 9/2013 |
| KR | 1020210030527 A | 3/2021 |

* cited by examiner

*Primary Examiner* — J. E. Schoenholtz
(74) *Attorney, Agent, or Firm* — CANTOR COLBURN LLP

(57) ABSTRACT

A display apparatus includes a cover window including a display panel area and a component area surrounding the display panel area, a display panel on the cover window, in the display panel area, and including a display element, a metal plate on the display panel, a first cover window light-shielding layer on the cover window in the component area and including a component hole, a second cover window light-shielding layer on the cover window and adjacent to the display panel, and a lateral light-shielding layer covering one lateral surface of the display panel adjacent to the component hole, and contacting the second cover window light-shielding layer.

20 Claims, 13 Drawing Sheets

DISPLAY APPARATUS AND METHOD OF MANUFACTURING THE SAME

This application claims priority to Korean Patent Application No. 10-2022-0094028, filed on Jul. 28, 2022, and all the benefits accruing therefrom under 35 U.S.C. § 119, the content of which in its entirety is herein incorporated by reference.

BACKGROUND

1. Field

Embodiments relate to display apparatuses, and more particularly, to display apparatuses in which malfunction of a component due to light leakage in a lateral direction of a display panel may be prevented and, at the same time, malfunction and damage of the display panel due to electrostatic discharge may be prevented.

2. Description of the Related Art

Recently, a usage of display apparatuses is being diversified. Accordingly, functions that are linked to or associated with display apparatuses are also being diversified. To perform such functions, the display apparatuses include a component. The component may be affected by light generated around the component.

SUMMARY

Friction may occur between a user and/or an external object during use. Due to such friction, static electricity may be accumulated in a cover window or the like included in display apparatuses.

Embodiments include a display apparatus in which malfunction of a component due to light leakage in a lateral direction of a display panel may be prevented and, at the same time, malfunction and damage of the display panel may be prevented. However, the embodiments are only examples, and the scope of the disclosure is not limited thereto.

Additional features will be set forth in part in the description which follows and, in part, will be apparent from the description, or may be learned by practice of the embodiments of the disclosure.

In an embodiment of the disclosure, a display apparatus includes a cover window including a display panel area and a component area surrounding the display panel area, a display panel on the cover window in the display panel area and including a display element, a metal plate on the display panel, a first cover window light-shielding layer which is disposed on the cover window in the component area and in which a component hole is defined, a second cover window light-shielding layer on the cover window and adjacent to the display panel, and a lateral light-shielding layer covering a lateral surface of the display panel adjacent to the component hole, and contacting the second cover window light-shielding layer.

In an embodiment, the second cover window light-shielding layer may cover the cover window.

In an embodiment, the lateral light-shielding layer may cover a lateral surface of the metal plate and a first surface of the second cover window light-shielding layer opposite to a second surface of the second cover window light-shielding layer facing the cover window.

In an embodiment, the lateral light-shielding layer may extend along the lateral surface of the display panel and surround at least a part of the display panel.

In an embodiment, an optical density of the lateral light-shielding layer may be 0.5 to 1.9.

In an embodiment, the lateral light-shielding layer may include a resin layer and conductive particles.

In an embodiment, the conductive particles may constitute wires, rods, or tubes.

In an embodiment, the conductive particles may include at least one of silver (Ag), copper (Cu), and graphene.

In an embodiment, the display apparatus may further include an optical functional layer interposed between the cover window and the display panel, and an adhesive layer interposed between the cover window and the optical functional layer. The lateral light-shielding layer may be unitary as a single body and cover a lateral surface of the adhesive layer, a lateral surface of the optical functional layer, a lateral surface of the display panel, a lateral surface of the metal plate, and a first surface of the second cover window light-shielding layer opposite to a second surface of the second cover window light-shielding layer facing the cover window.

In an embodiment, the display apparatus may further include a component overlapping the component hole.

In an embodiment of the disclosure, a method of manufacturing a display apparatus includes attaching, over a display panel, a cover window on which a first cover window light-shielding layer and a second cover window light-shielding layer are disposed, such that the display panel including a display element and a component hole defined in the first cover window light-shielding layer do not overlap each other in a plan view, attaching a metal plate on the display panel, and forming a lateral light-shielding layer to cover a lateral surface of the display panel adjacent to the component hole and contact the metal plate and the second cover window light-shielding layer.

In an embodiment, the second cover window light-shielding layer may cover the cover window.

In an embodiment, the forming the lateral light-shielding layer may include forming the lateral light-shielding layer such that the lateral light-shielding layer covers a lateral surface of the metal plate and a first surface of the second cover window light-shielding layer opposite to a second surface of the second cover window light-shielding layer facing the cover window.

In an embodiment, the forming the lateral light-shielding layer may include forming the lateral light-shielding layer such that the lateral light-shielding layer surrounds at least a part of the display panel.

In an embodiment, the forming the lateral light-shielding layer may include forming the lateral light-shielding layer such that an optical density of the lateral light-shielding layer is 0.5 to 1.9.

In an embodiment, the forming the lateral light-shielding layer may include forming the lateral light-shielding layer such that the lateral light-shielding layer includes a resin layer and conductive particles.

In an embodiment, the forming the lateral light-shielding layer may include forming the lateral light-shielding layer such that the conductive particles constitute wires, rods, or tubes.

In an embodiment, the forming the lateral light-shielding layer may include forming the lateral light-shielding layer such that the conductive particles include at least one of silver (Ag), copper (Cu), and graphene.

In an embodiment, the attaching the cover window may include attaching an optical functional layer onto the display panel, and attaching an adhesive layer on the cover window, and the forming the lateral light-shielding layer may include integrally forming the lateral light-shielding layer such that the lateral light-shielding layer covers a lateral surface of the adhesive layer, a lateral surface of the optical functional layer, the lateral surface of the display panel, a lateral surface of the metal plate, and a first surface of the second cover window light-shielding layer opposite to a second surface of the second cover window light-shielding layer facing the cover window.

In an embodiment, the method may further include arranging a component to overlap the component hole.

These and/or other features will become apparent and more readily appreciated from the following detailed description of the embodiments, the accompanying drawings, and claims.

BRIEF DESCRIPTION OF THE DRAWINGS

The above and other features and advantages of illustrative embodiments of the disclosure will be more apparent from the following description taken in conjunction with the accompanying drawings, in which.

DETAILED DESCRIPTION

Figure 1:
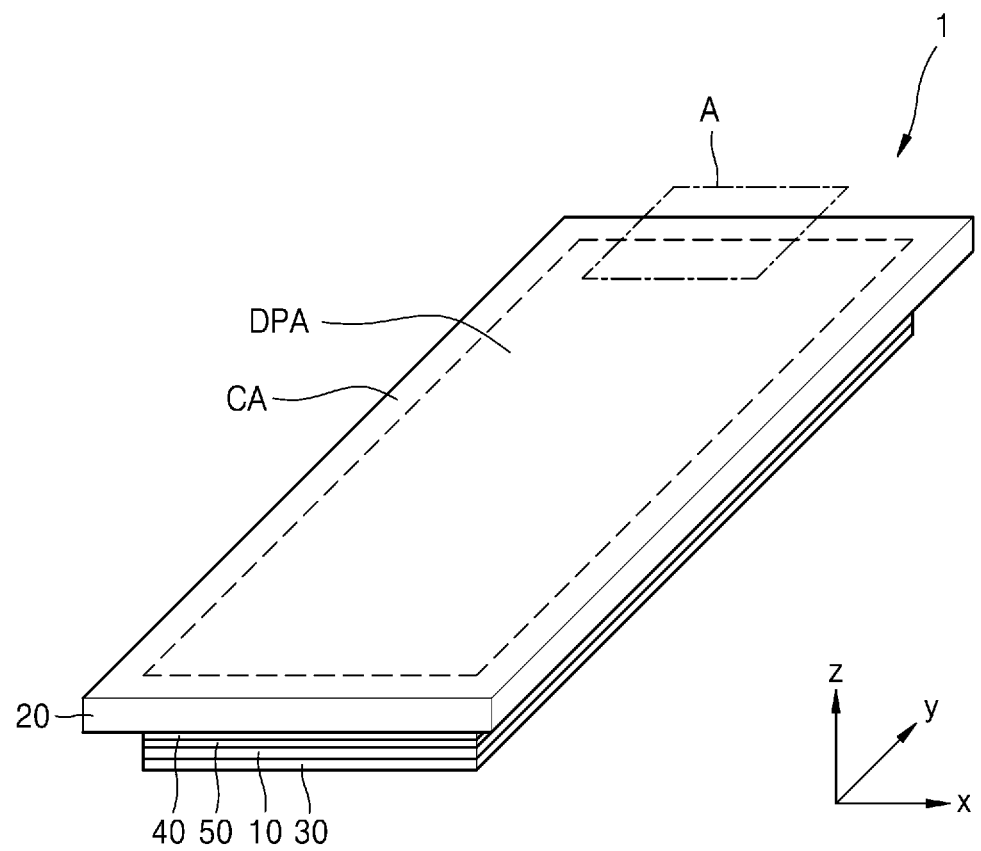
FIG. 1 is a perspective view schematically illustrating an embodiment of a part of a display apparatus.

Reference will now be made in detail to embodiments, examples of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or any variations thereof.

As the disclosure allows for various changes and numerous embodiments, illustrative embodiments will be illustrated in the drawings and described in detail in the written description. Hereinafter, effects and features of the disclosure and a method for accomplishing them will be described more fully with reference to the accompanying drawings, in which embodiments of the disclosure are shown. This disclosure may, however, be embodied in many different forms and should not be construed as limited to the embodiments set forth herein.

Hereinafter, embodiments will be described with reference to the accompanying drawings, where like reference numerals refer to like elements throughout and a repeated description thereof is omitted.

It will be understood that when an element, such as a layer, a film, a region, or a plate, is referred to as being "on" another element, the element can be directly on the other element or intervening elements may be thereon. Sizes of elements in the drawings may be exaggerated or reduced for convenience of description. Since sizes and thicknesses of elements in the drawings are arbitrarily illustrated for convenience of explanation, for example, the disclosure is not limited thereto.

In the following embodiments, the x-axis, the y-axis, and the z-axis are not limited to three axes of the rectangular coordinate system, and may be interpreted in a broader sense. The x-axis, the y-axis, and the z-axis may be perpendicular to one another, or may represent different directions that are not perpendicular to one another, for example.

It will be understood that although terms such as "first" and "second" may be used herein to describe various elements, these elements should not be limited by these terms and these terms are only used to distinguish one element from another element.

In an embodiment below, an expression used in the singular encompasses the expression of the plural, unless it has a clearly different meaning in the context.

In an embodiment below, it will be further understood that the terms "comprises" and/or "comprising" used herein specify the presence of stated features or elements, but do not preclude the presence or addition of one or more other features or elements.

In embodiments below, the term "in a plan view" may mean that an element is viewed from the top.

In the disclosure, "A and/or B" may include "A," "B," or "A and B." In addition, in the disclosure, "at least one of A and B" may include "A," "B," or "A and B."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
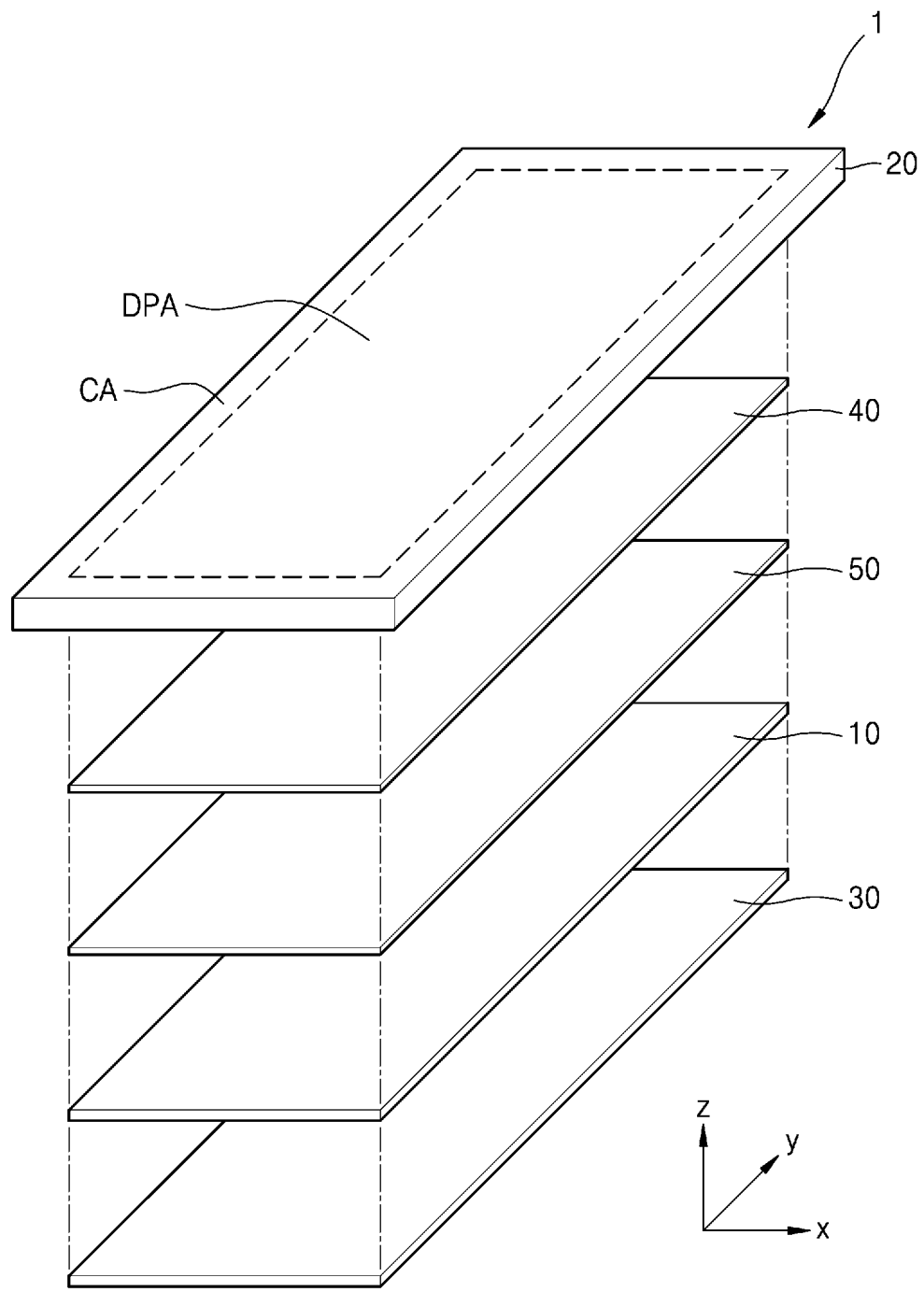
FIG. 2 is an exploded perspective view schematically illustrating an embodiment of a part of a display apparatus.

FIG. 1 is a perspective view schematically illustrating an embodiment of a part of a display apparatus 1 in an embodiment, and FIG. 2 is an exploded perspective view schematically illustrating an embodiment of a part of the display apparatus 1.

The display apparatus 1, which is an apparatus for displaying a moving image or still image, may be portable electronic devices, such as mobile phones, smartphones, tablet personal computers ("PC"), mobile communication terminals, electronic notebooks, electronic books, portable multimedia players ("PMP"), navigations, or ultra-mobile PCs ("UMPC"). In addition, the display apparatus 1 may be electronic devices, such as televisions, notebook PCs, monitors, advertisement boards, or Internet of things ("IoT"). In an alternative embodiment, the display apparatus 1 may be wearable devices, such as smartwatches, watchphones, glasses-type displays, or head-mounted displays ("HMD"). In an alternative embodiment, the display apparatus 1 may be a part of another apparatus. In an embodiment, the display apparatus 1 may be a display unit of any electronic apparatus, for example. In an alternative embodiment, the display apparatus 1 may be an instrument panel of a vehicle or a center information display ("CID") arranged on a center fascia or a dashboard of a vehicle, a room mirror display for replacing side-view mirrors of a vehicle, and a display unit arranged on a rear surface of a front seat as entertainment for a backseat of a vehicle.

Referring to FIGS. 1 and 2, the display apparatus 1 may include a display panel area DPA and a component area CA surrounding the display panel area DPA.

The display panel area DPA may be an area in which a display panel 10 is arranged. Accordingly, the display apparatus 1 may provide an image through an array of a plurality of pixels two-dimensionally arranged in the display panel area DPA. Each of the pixels of the display apparatus 1 may be an area in which light of a color may be emitted, and the display apparatus 1 may provide an image by light emitted from the pixels. In an embodiment, each of the pixels may emit red, green, or blue light, for example. In an embodiment, an adhesive layer 40, an optical functional layer 50, and a metal plate 30 may be arranged in the display panel area DPA.

The display panel area DPA may have a polygonal shape, including a quadrilateral shape, as shown in FIGS. 1 and 2. In an embodiment, the display panel area DPA may have a quadrangular (e.g., rectangular) shape of which a horizontal length is greater than a vertical length, a quadrangular (e.g., rectangular) shape of which a horizontal length is less than a vertical length, or a square shape, for example. In an alternative embodiment, the display panel area DPA may have various shapes, such as an ellipse or circle.

The component area CA may be an area in which the display panel 10 is not arranged, and may at least partially surround the display panel area DPA. In an embodiment, the component area CA may be an area in which a component is arranged, for example. In an embodiment, the adhesive layer 40, the optical functional layer 50, and the metal plate 30 may not be arranged in the component area CA.

Referring to FIGS. 1 and 2, the display apparatus 1 may include the display panel 10, a cover window 20, and the metal plate 30. The display panel 10 may display an image. In other words, an image provided by the display apparatus 1 may be understood as being implemented by the display panel 10. The display panel 10 may include a plurality of display elements, and the plurality of display elements may emit light. Accordingly, the display panel 10 may display an image by light emitted by the plurality of display elements.

In an embodiment, the display element may be an organic light-emitting diode including an organic emission layer. In an alternative embodiment, the display element may be a light-emitting diode ("LED"). A size of the LED may be on a microscale or nanoscale. In an embodiment, the LED may be a micro LED, for example. In an alternative embodiment, the LED may be a nanorod LED. The nanorod LED may include a gallium nitride (GaN). In an embodiment, a color conversion layer may be disposed on the nanorod LED. The color conversion layer may include quantum dots. In an alternative embodiment, the display element may be a quantum dot LED including a quantum dot emission layer. In an alternative embodiment, the display element may be an inorganic LED including an inorganic semiconductor. In some embodiments, a protective layer (not shown) may be disposed under the display panel 10. That is, the protective layer may be disposed on a lower surface of the display panel 10. The protective layer may prevent the display panel 10 from external shock and may include a polymer material and/or an inorganic material.

The cover window 20 may be disposed on an upper surface (in a +z direction) of the display panel 10. Here, the "upper surface" of the display panel 10 may be defined as a surface facing a direction in which the display panel 10 provides an image. In an embodiment, the cover window 20 may be arranged to cover the upper surface of the display panel 10. The cover window 20 may protect the upper surface of the display panel 10. In addition, the cover window 20 constitutes the exterior of the display apparatus 1 and thus may include a flat surface and curved surface corresponding to a shape of the display apparatus 1.

The cover window 20 may include glass, sapphire, or plastic. In an embodiment, the cover window 20 may be ultra-thin glass ("UTG®"), which is obtained by strengthening by methods, such as chemical strengthening or thermal strengthening, or may be colorless polyimide ("CPI"), for example. The cover window 20 may have a structure in which a flexible polymer layer is disposed on one surface of a glass substrate, or may include only a polymer layer. An image displayed on the display panel 10 may be provided to a user through the cover window 20 that is transparent.

The cover window 20 may have a high transmittance so as to transmit light emitted from the display panel 10, or may have a small thickness in order to minimize a weight of the display apparatus 1. In addition, the cover window 20 may have a large strength and hardness so as to protect the display panel 10 from external shock. The cover window 20 may be a flexible window. The cover window 20 may protect the display panel 10 by being easily bent according to an external force without cracks or the like.

The metal plate 30 may be disposed under the display panel 10 and support the display panel 10. The metal plate 30 may be a plate including a metal material. In other words, the metal plate 30 may include a metal or an alloy including at least two kinds of metals. In an embodiment, the metal plate 30 may include aluminum (Al), copper (Cu), iron (Fe), or chrome (Cr), for example. However, the disclosure is not limited thereto. An adhesive member may be interposed between the metal plate 30 and the display panel 10. Such an adhesive member may couple the metal plate 30 and the display panel 10 to each other.

In addition, since the metal plate 30 has large thermal conductivity, heat generated from the display panel 10 may be diffused, and static electricity may not be accumulated in the cover window 20 and/or the display panel 10.

The display apparatus 1 may further include the optical functional layer 50 and the adhesive layer 40. The optical functional layer 50 may be interposed between the cover window 20 and the display panel 10. The optical functional layer 50 may reduce reflectivity of light (e.g., external light) incident toward the display panel 10 from the outside. Accordingly, the optical functional layer 50 may improve color purity of light emitted from the display panel 10. The optical functional layer 50 may include a retarder and a polarizer, or may include a black matrix and color filters. An adhesive member may be interposed between the optical functional layer 50 and the display panel 10. Such an adhesive member may couple the optical functional layer 50 and the display panel 10 together.

The adhesive layer 40 may be interposed between the cover window 20 and the optical functional layer 50. In other words, the optical functional layer 50 may be interposed between the adhesive layer 40 and the display panel 10. The cover window may be attached onto the optical functional layer 50 by the adhesive layer 40. In an embodiment, the adhesive layer 40 may include an adhesive member, such as an optical clear adhesive ("OCA") or a pressure sensitive adhesive ("PSA").

Although not shown, the display apparatus 1 may further include a housing (not shown). The housing may be coupled to the cover window 20 and provide the exterior of the display apparatus 1, and stably protect, from external shock, elements of the display apparatus 1 accommodated in an inner space thereof. To this end, the housing may include an inner surface defining an accommodation space, and the inner surface of the housing may not be a surface constituting the exterior of the display apparatus 1. In an embodiment, the display panel 10 may be arranged in the accommodation space of the housing, for example.

Figure 3:
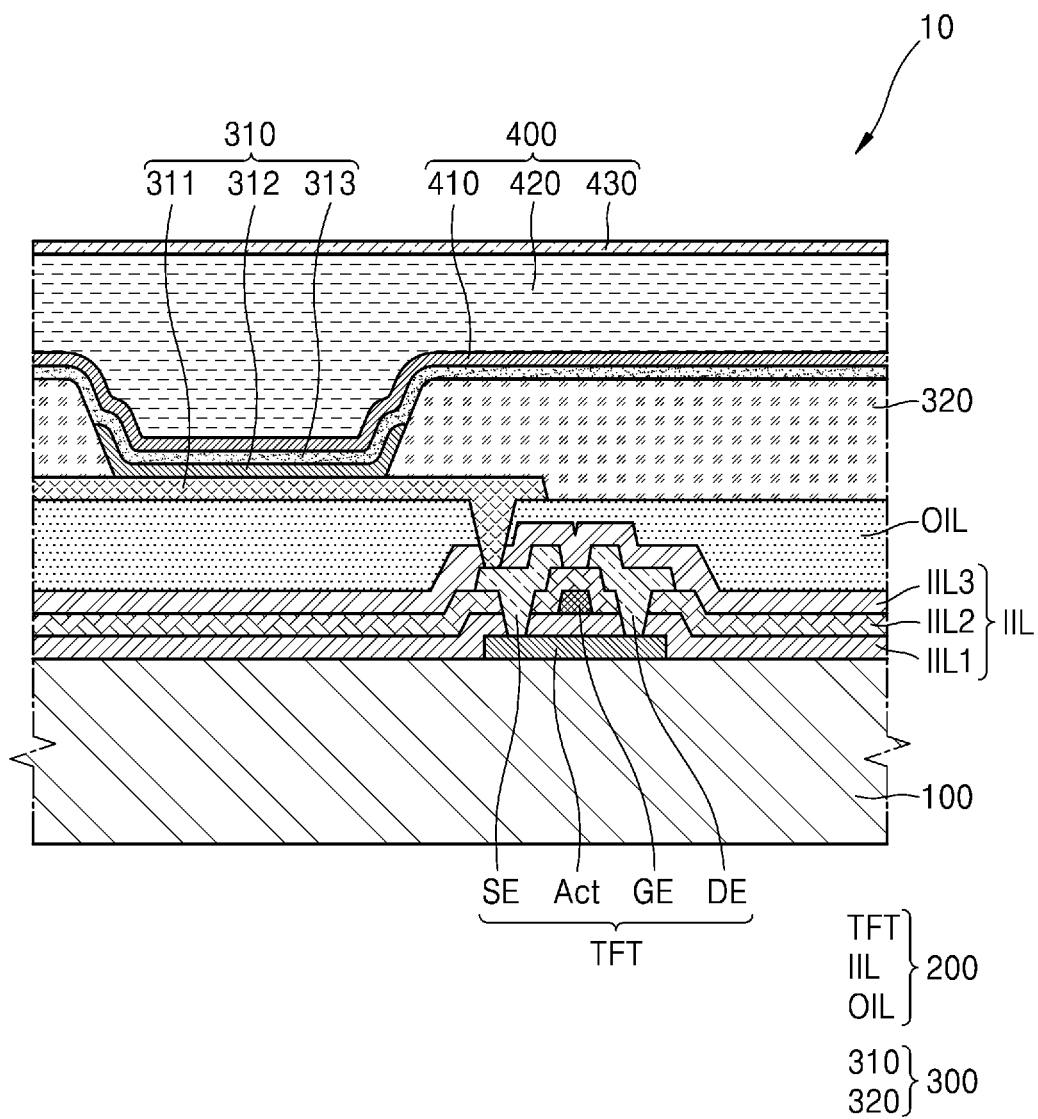
FIG. 3 is a cross-sectional view schematically illustrating an embodiment of a part of a display panel included in a display apparatus.

FIG. 3 is a cross-sectional view schematically illustrating an embodiment of a part of the display panel 10 included in the display apparatus 1. Referring to FIG. 3, the display panel 10 may include a substrate 100, a circuit layer 200, a display element layer 300, and an encapsulation layer 400.

The substrate 100 may include glass, metal, or polymer resin. It is desired that the substrate 100 is flexible or bendable. In this case, the substrate 100 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. However, various modifications may be made. In an embodiment, the substrate 100 may have a multi-layer structure of two layers and a barrier layer therebetween. The two layers may include the polymer resin described above, and the barrier layer includes an inorganic material (silicon oxide ($SiO_x$), silicon nitride ($SiN_x$), silicon oxynitride ($SiO_xN_y$)), for example.

The circuit layer 200 may be disposed on the substrate 100. The circuit layer 200 may include a transistor TFT, an inorganic insulating layer IL, and an organic insulating layer OL. The transistor TFT may include a semiconductor layer Act, a gate electrode GE, a source electrode SE, and a drain electrode DE. The inorganic insulating layer IIL may include a gate insulating layer IIL1, a first inter-insulating layer IIL2, and a second inter-insulating layer IIL3.

The semiconductor layer Act may be disposed on the substrate 100. The semiconductor layer Act may include polysilicon. In an alternative embodiment, the semiconductor layer Act may include amorphous silicon, an oxide semiconductor, or an organic semiconductor. In an embodiment, the semiconductor layer Act may include a channel region, a source region, and a drain region, the source region and the drain region being at opposite sides of the channel region.

The gate insulating layer IIL1 may be disposed on the semiconductor layer Act and the substrate 100. The gate insulating layer IIL1 may include an inorganic insulating material, such as $SiO_x$, $SiN_x$, $SiO_xN_y$, aluminum oxide ($Al_2O_3$), titanium oxide ($TiO_2$), tantalum oxide ($Ta_2O_5$), hafnium oxide ($HfO_2$), or zinc oxide ($ZnO_x$). $ZnO_x$ may include zinc oxide (ZnO) and/or zinc peroxide ($ZnO_2$).

The gate electrode GE may be disposed on the gate insulating layer IIL1. In other words, the gate insulating layer IIL1 may be between the semiconductor layer Act and the gate electrode GE so that insulation between the semiconductor layer Act and the gate electrode GE may be ensured. The gate electrode GE may overlap the channel region of the semiconductor layer Act. The gate electrode GE may include a low-resistance metal material. In an embodiment, the gate electrode GE may include a conductive material, including molybdenum (Mo), aluminum (Al), copper (Cu), and titanium (Ti), and may have a single-layer or multi-layer structure including the conductive material.

The first inter-insulating layer IIL2 may be disposed on the gate electrode GE and the gate insulating layer IIL1. The first inter-insulating layer IIL2 may include an inorganic insulating material, such as $SiO_x$, $SiN_x$, $SiO_xN_y$, $Al_2O_3$, $TiO_2$, $Ta_2O_5$, $HfO_2$, or $ZnO_x$.

The source electrode SE and the drain electrode DE may be disposed on the first inter-insulating layer IIL2. Each of the source electrode SE and the drain electrode DE may be connected to the semiconductor layer Act via a contact hole defined in the gate insulating layer IIL1 and the first inter-insulating layer IIL2. At least one of the source electrode SE or the drain electrode DE may include a conductive material, including Mo, Al, Cu, or Ti, and may have a single-layer or multi-layer structure including the conductive material. In an embodiment, at least one of the source electrode SE and the drain electrode DE may have a multi-layer structure of a Ti layer, an Al layer, and another Ti layer.

The second inter-insulating layer IIL3 may be disposed on the source electrode SE, the drain electrode DE, and the first inter-insulating layer IIL2. The second inter-insulating layer IIL3 may include an inorganic insulating material, such as $SiO_x$, $SiN_x$, $SiO_xN_y$, $Al_2O_3$, $TiO_2$, $Ta_2O_5$, $HfO_2$, or $ZnO_x$.

An organic insulating layer OIL may be disposed on the second inter-insulating layer IIL3. The organic insulating layer OIL may substantially planarize an upper portion of the circuit layer 200. In an embodiment, the organic insulating layer OIL may include an organic material, such as acryl, benzocyclobutene ("BCB"), or hexamethyldisiloxane ("HMDSO"), for example. In FIG. 3, the organic insulating layer OL include a single layer. However, the organic insulating layer OL may include a plurality of layers, and various modifications may be made.

The display element layer 300 may be disposed on the circuit layer 200. The display element layer 300 may include a display element 310 and a pixel-defining layer 320. The display element 310 may be electrically connected to the transistor TFT. In an embodiment, the display element 310 may be an organic light-emitting diode including a pixel electrode 311, an opposite electrode 313, and an intermediate layer 312. The intermediate layer 312 may be interposed between the pixel electrode 311 and the opposite electrode 313 and includes an emission layer. The display element 310 being electrically connected to the transistor TFT may be understood as the pixel electrode 311 of the organic light-emitting diode being electrically connected to the transistor TFT.

The pixel electrode 311 may be electrically connected to the transistor TFT by being in contact with any of the source electrode SE and the drain electrode DE via a contact hole defined in the second inter-insulating layer IIL3 and the organic insulating layer OL. The pixel electrode 311 may include a conductive oxide, such as indium tin oxide ("ITO"), indium zinc oxide ("IZO"), ZnO, indium oxide (In$_2$O$_3$), indium gallium oxide, or aluminum zinc oxide ("AZO"). In another embodiment, the pixel electrode 311 may include a reflective layer including silver (Ag), magnesium (Mg), Al, platinum (Pt), palladium (Pd), gold (Au), nickel (Ni), neodymium (Nd), iridium (Ir), chrome (Cr), or any compounds thereof. In another embodiment, the pixel electrode 311 may further include a layer including ITO, IZO, ZnO, or In$_2$O$_3$, above/under the reflective layer described above.

The pixel-defining layer 320 may cover an edge of the pixel electrode 311. The pixel-defining layer 320 may include a pixel opening, and the pixel opening may overlap the pixel electrode 311. The pixel opening may define an emission area of light emitted by the display element 310. The pixel-defining layer 320 may include an organic insulating material and/or an inorganic insulating material. In some embodiments, the pixel-defining layer 320 may include a light-shielding material.

The intermediate layer 312 may be disposed on the pixel electrode 311 and the pixel-defining layer 320. The intermediate layer 312 may include a low-molecular weight material or a polymer material. When the intermediate layer 312 includes a low-molecular weight material, the intermediate layer 312 may have a structure in which a hole injection layer ("HIL"), a hole transport layer ("HTL"), an emission layer ("EML"), an electron transport layer ("ETL"), an electron injection layer ("EIL"), or the like are stacked in a single or complex structure, and may be formed by vacuum deposition. When the intermediate layer 312 includes a polymer material, the intermediate layer 312 may have a structure including the HTL and the EML. In this case, the HTL may include poly(3,4-ethylenedioxythiophene) ("PEDOT"), and the EML may include a polymer material, such as a polyphenylene vinylene-based material or a polyfluorene-based material. The intermediate layer 312 may be formed by methods, such as screen printing, inkjet printing, or laser induced thermal imaging ("LITI"). However, the intermediate layer 312 is not necessarily limited thereto and may have various structures. In addition, the intermediate layer 312 may include a layer that is unitary as a single body across a plurality of pixel electrodes 311, and may include a layer that is patterned to correspond to each of the plurality of pixel electrodes 311.

The opposite electrode 313 may be disposed on the intermediate layer 312 and the pixel-defining layer 320. The opposite electrode 313 may be unitary as a single body across a plurality of organic light-emitting diodes and correspond to the plurality of pixel electrodes 311. The opposite electrode 313 may include a transmissive conductive layer including ITO, In$_2$O$_3$, or IZO, or may include a semi-transmissive layer including metal, such as Al or Ag. In an embodiment, the opposite electrode 313 may be a semi-transmissive layer including Mg or Ag, for example.

Since the display element 310 may be easily damaged by external moisture or oxygen, the encapsulation layer 400 may cover and protect the display element 310. The encapsulation layer 400 may include a first inorganic encapsulation layer 410, an organic encapsulation layer 420, and a second inorganic encapsulation layer 430, as shown in FIG. 3.

The first inorganic encapsulation layer 410 may cover the opposite electrode 313 and may include SiO$_x$, SiN$_x$, and/or SiO$_x$N$_y$. When desired, other layers, such as a capping layer, may be interposed between the first inorganic encapsulation layer 410 and the opposite electrode 313. Since the first inorganic encapsulation layer 410 is formed along an underlying structure thereof, an upper surface of the first inorganic encapsulation layer 410 may not be flat, as shown in FIG. 3. The organic encapsulation layer 420 may cover the first inorganic encapsulation layer 410, and unlike the first inorganic encapsulation layer 410, an upper surface of the organic encapsulation layer 420 may be approximately flat. The organic encapsulation layer 420 may include at least one material selected from the group including polyethylene terephthalate, polyethylene naphthalate, polycarbonate, polyimide, polyethylene sulfonate, polyoxymethylene, polyarylate, and HMDSO. The second inorganic encapsulation layer 430 may cover the organic encapsulation layer 420 and may include SiO$_x$, SiN$_x$, and/or SiO$_x$N$_y$.

Since the encapsulation layer 400 includes the first inorganic encapsulation layer 410, the organic encapsulation layer 420, and the second inorganic encapsulation layer 430, even when cracks occur in the encapsulation layer 400 through the multi-layer structure, such cracks may not be connected between the first inorganic encapsulation layer 410 and the organic encapsulation layer 420 or between the organic encapsulation layer 420 and the second inorganic encapsulation layer 430. Accordingly, the formation of a passage through which external moisture or oxygen permeates into the display panel 10 may be prevented or minimized.

Figure 4:
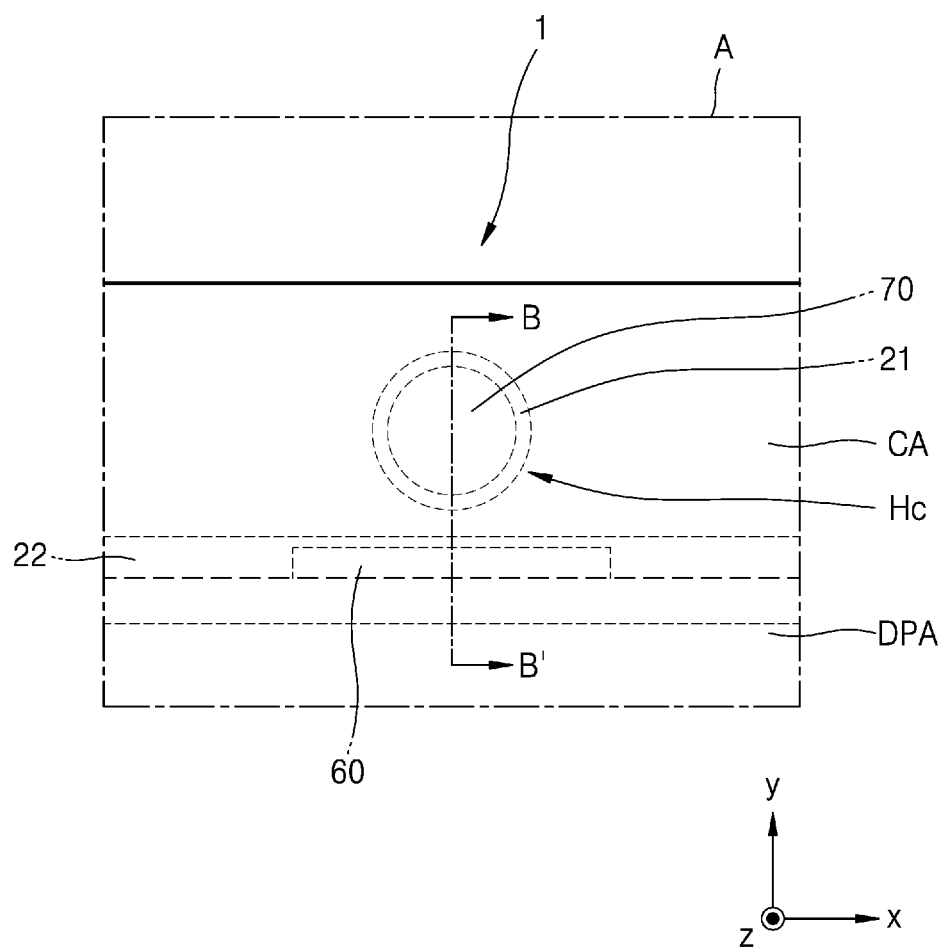
FIG. 4 is an enlarged plan view schematically illustrating region A of the display apparatus in FIG. 1.
Figure 5:
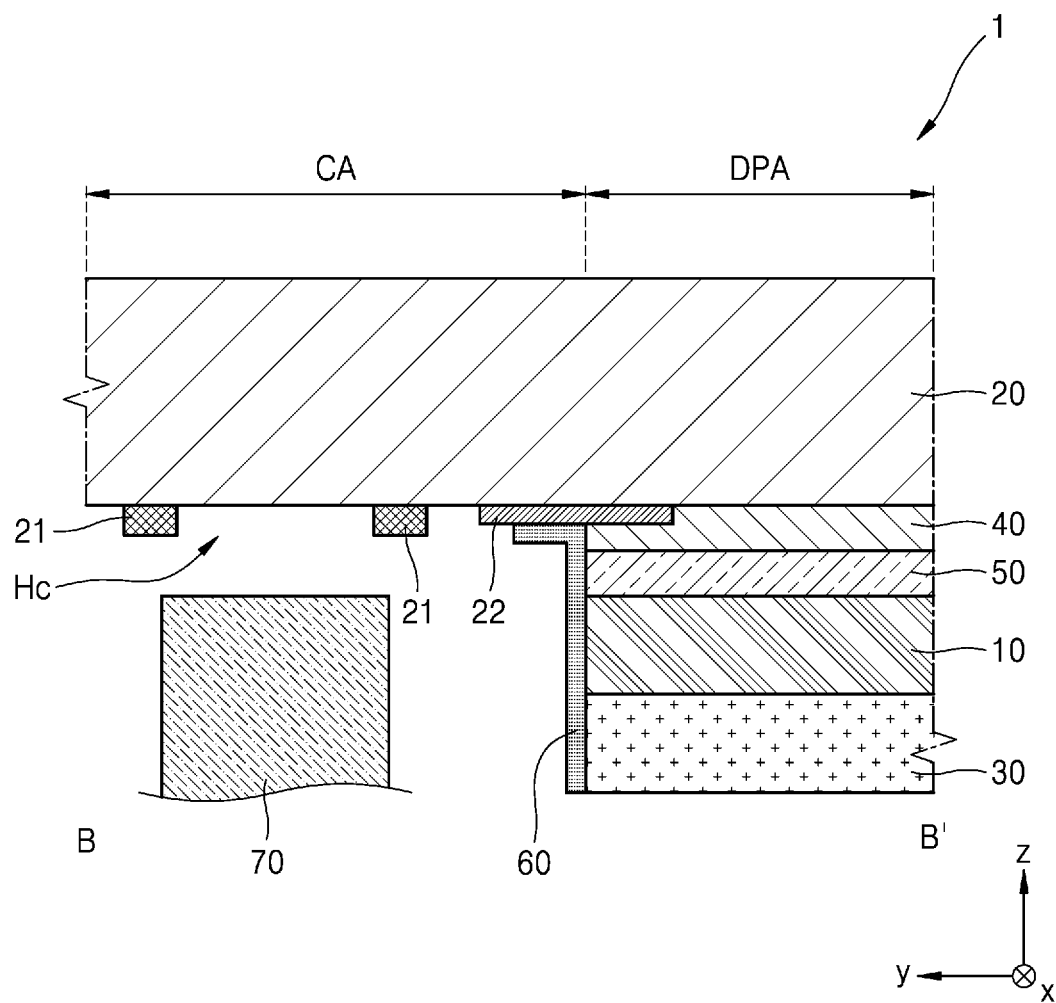
FIG. 5 is a cross-sectional view schematically illustrating a cross-section of the display apparatus, taken along line B-B' in FIG. 4.

FIG. 4 is an enlarged plan view schematically illustrating region A of the display apparatus 1 in FIG. 1, and FIG. 5 is a cross-sectional view schematically illustrating a cross-section of the display apparatus 1, taken along line B-B' in FIG. 4. In FIG. 4, a plan view on the cover window 20 is shown. However, for convenience of description, a first cover window light-shielding layer 21, a second cover window light-shielding layer 22, a lateral light-shielding layer 60, a component hole Hc, and a component 70, which are disposed or defined under the cover window 20, are shown together with the cover window 20.

Referring to FIGS. 4 and 5, the display apparatus 1 may include the display panel area DPA and the component area CA surrounding at least a part of the display panel area DPA. Since the display apparatus 1 includes the cover window 20, it may be said that the cover window 20 includes the display panel area DPA and the component area CA as described above. Hereinafter, for convenience of description, it is described that the cover window 20 includes the display panel area DPA and the component area CA.

The display panel 10 may be disposed in the display panel area DPA. In an embodiment, in the display panel area DPA, the adhesive layer 40, the optical functional layer 50, the display panel 10, and the metal plate 30 may be sequentially disposed under the cover window 20, for example. In other words, in the display panel area DPA, the adhesive layer 40 may be disposed under the cover window 20, and the optical functional layer 50 may be disposed under the adhesive layer 40. In the display panel area DPA, the display panel 10 may be disposed under the optical functional layer 50, and the metal plate 30 may be disposed under the display panel 10.

The display panel 10 may not be disposed in the component area CA. In an embodiment, in the component area CA, the adhesive layer 40, the optical functional layer 50, the display panel 10, and the metal plate 30 may not be disposed under the cover window 20, for example. In other words, the component area CA may be an area in which the cover window 20 does not overlap the adhesive layer 40, the optical functional layer 50, the display panel 10, and/or the metal plate 30.

In the component area CA, the component 70 may be disposed under the cover window 20. In an embodiment, the component 70 may be arranged on an inner surface of the housing described above, for example. The component 70 is a camera using infrared or visible light and may include an imaging device. In an alternative embodiment, the component 70 may include an illumination sensor, a proximity sensor, or an iris sensor. In an embodiment, the component 70 may be disposed over the display apparatus 1. However, the disclosure is not limited thereto. The component 70 may be disposed under the display apparatus 1, or arranged on a right side or a left side of the display apparatus 1.

In an embodiment, in the component area CA, the first cover window light-shielding layer 21 may be further disposed under the cover window 20. The component hole Hc may be defined in the first cover window light-shielding layer 21. In this case, the component 70 may be disposed under the component hole Hc. In an embodiment, in a plan view, the component 70 may be arranged to overlap the component hole Hc, for example. In other words, the first cover window light-shielding layer 21 may surround the component 70 in a plan view. The component 70 may overlap the component hole Hc defined in the first cover window light-shielding layer 21 so that the component 70 is arranged at a preset position in the component area CA. Since the first cover window light-shielding layer 21 includes the component hole Hc, the first cover window light-shielding layer 21 arranged in the component area CA may have a ring shape.

In an embodiment, in the component area CA, the second cover window light-shielding layer 22 may be further disposed under the cover window 20. The second cover window light-shielding layer 22 may contact the cover window 20. In other words, the second cover window light-shielding layer 22 may cover a part of the cover window 20. In an embodiment, the second cover window light-shielding layer 22 may cover a part of a lower surface (in a −z direction) of the cover window 20, for example.

The second cover window light-shielding layer 22 may be arranged adjacent to the display panel 10. In an embodiment, a part of the second cover window light-shielding layer 22 may be arranged in the component area CA, and another part of the second cover window light-shielding layer 22 may be arranged in the display panel area DPA, for example. Another part of the second cover window light-shielding layer 22 may be disposed over the display panel 10. In other words, in a plan view, another part of the second cover window light-shielding layer 22 may be arranged to overlap the display panel 10. In this case, a part of the second cover window light-shielding layer 22 may cover a part of the cover window 20 in the component area CA, and another part of the second cover window light-shielding layer 22 may cover a part of the cover window 20 in the display panel area DPA.

The first cover window light-shielding layer 21 and the second cover window light-shielding layer 22 may include a light-shielding material. The light-shielding material may include at least one of a blue pigment, black dye, and black particles. In an embodiment, the light-shielding material may include at least one of Cr, chrome oxide ($CrO_x$), and chrome nitride ($CrN_x$), or may include resin, graphite, non-Cr-based or lactam-based pigment, or perylene-based pigment, for example. The black pigment may include at least one type selected from among the group including aniline black, lactam black, and perylene black. In an embodiment, the light-shielding material may include an opaque insulating material, such as carbon, carbon black, diamond-like carbon, black acryl, or black matrix. The first cover window light-shielding layer 21 and the second cover window light-shielding layer 22 may further include acryl-based epoxy, for example. In an embodiment, the first cover window light-shielding layer 21 and the second cover window light-shielding layer 22 may include at least one of acryl-based epoxy and carbon, for example.

Since the second cover window light-shielding layer 22 overlapping the display panel 10 includes a light-shielding material, light may be blocked such that a line or circuit of the display panel 10 is not identified from the outside. In addition, since the first cover window light-shielding layer 21 surrounding the component 70 includes a light-shielding material, an impact received by the component 70 due to unintentional light may be reduced.

Figure 6:
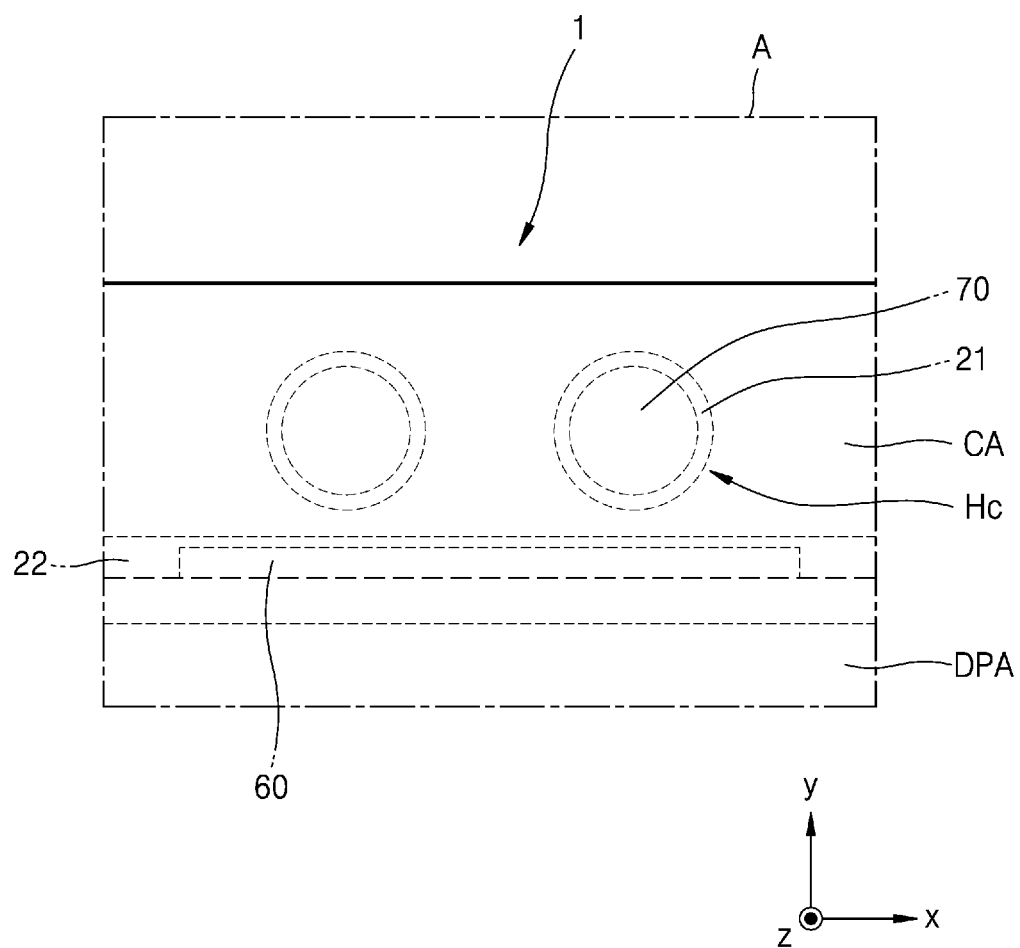
FIG. 6 is an enlarged plan view schematically illustrating another embodiment of region A of a display apparatus in FIG. 1.

In FIG. 4, the display apparatus 1 includes one component 70. However, the disclosure is not limited thereto. FIG. 6 is an enlarged plan view schematically illustrating another embodiment of region A of the display apparatus 1 in FIG. 1. As as shown in FIG. 6, the display apparatus 1 may include a plurality of components 70, for example. In this case, each of the plurality of components 70 may be surrounded by the first cover window light-shielding layer 21 in a plan view. In other words, each of the plurality of components 70 may be disposed under the component hole Hc included in the first cover window light-shielding layer 21. The first cover window light-shielding layer 21 may be provided in plural number, and the component hole Hc may be defined in each of the first cover window light-shielding layers 21 provided in plural number. In an alternative embodiment, all of the plurality of component holes Hc may be defined in a single first cover window light-shielding layer 21 unitary as a single body.

The lateral light-shielding layer 60 may be arranged in the component area CA. As shown in FIG. 5, the lateral light-shielding layer 60 may cover one lateral surface of the display panel 10. In an embodiment, the lateral light-shielding layer 60 may cover one lateral surface of the display panel 10 that is adjacent to the component hole Hc, for example. In other words, the lateral light-shielding layer 60 may cover one lateral surface of the display panel 10 that is adjacent to the component 70.

The lateral light-shielding layer 60 may extend along a lateral surface of the display panel 10 to surround at least a part of the display panel 10. In an embodiment, as shown in FIG. 4, the lateral light-shielding layer 60 may extend along the lateral surface of the display panel 10 to surround at least a part of one side of the display panel 10 adjacent to the component hole Hc, for example. In other words, the lateral light-shielding layer 60 may extend along the lateral surface of the display panel 10 to surround at least a part of one side of the display panel 10 adjacent to the component 70. As shown in FIG. 6, when the component hole Hc is provided in plural number, the lateral light-shielding layer 60 may be arranged at portions of one side of the display panel 10 adjacent to the component holes Hc and between the portions. In other words, the lateral light-shielding layer 60 may be arranged at portions of one side of the display panel 10 adjacent to the components 70 and between the portions.

The lateral light-shielding layer 60 may be opaque. In an embodiment, an optical density (OD) of the lateral light-shielding layer 60 may be about 0.5 to about 1.9, for example, and in an embodiment, the optical density (OD) of the lateral light-shielding layer 60 may be about 0.9 to about 1.7, for example. The optical density (OD) is a numerical value indicating a degree to which a material absorbs light, and may satisfy $OD=\log_{10}(1/T)$. Here, T denotes a light transmittance. In other words, an optical density (OD) of a material being high denotes that the material absorbs light well, and when the optical density of the material is 0, a light transmittance becomes 1, which means that the material is transparent with respect to light.

In an embodiment, the lateral light-shielding layer 60 may include an opaque insulating material, such as carbon, carbon black, diamond-like carbon, black acryl, or black matrix. In another embodiment, the lateral light-shielding layer 60 may include a colored pigment, such as a black pigment or a pigment of another color. In an embodiment, the lateral light-shielding layer 60 may include at least one of a polyimide ("PI")-based binder and a pigment in which red, green, and blue are mixed together, for example. In an alternative embodiment, the lateral light-shielding layer 60 may include a cardo-based binder resin and a combination of a lactam black pigment and a blue pigment. In another embodiment, the lateral light-shielding layer 60 may include molybdenum (Mo)/molybdenum oxide ($MoO_x$).

As described above, the component 70 may include an imaging device as a camera using infrared or visible light, etc., or may include an illumination sensor, a proximity sensor, or an iris sensor. The component 70 may sensitively react to light. When the component 70 is arranged adjacent to the display panel 10 in a plan view, the component 70 may malfunction by light that is generated in the display panel 10 and proceeds in a direction to the component 70. In other words, the component 70 may malfunction due to light leakage in a lateral direction of the display panel 10.

However, in a case of the display apparatus 1 in the illustrated embodiment, the lateral light-shielding layer 60 that is opaque may cover one lateral surface of the display panel 10. Furthermore, the lateral light-shielding layer 60 may extend along a lateral surface of the display panel 10 to surround at least a part of one side of the display panel 10 adjacent to the component 70. Accordingly, light generated in the display panel 10 does not proceed in the direction to the component 70, and thus, the component 70 may not malfunction due to light leakage in the lateral direction of the display panel 10.

The lateral light-shielding layer 60 may contact the metal plate 30 and the second cover window light-shielding layer 22. In an embodiment, the lateral light-shielding layer 60 may be unitary as a single body to cover a lateral surface of the adhesive layer 40, a lateral surface of the optical functional layer 50, a lateral surface of the display panel 10, a lateral surface of the metal plate 30, and a lower surface (in the −z direction) of the second cover window light-shielding layer 22, for example. In an embodiment, a portion of the lateral light-shielding layer 60 may cover the lateral surface of the adhesive layer 40, the lateral surface of the optical functional layer 50, the lateral surface of the display panel 10, and the lateral surface of the metal plate 30, and another portion of the lateral light-shielding layer 60 may cover the lower surface (in the −z direction) of the second cover window light-shielding layer 22 disposed under the cover window 20, for example.

Figure 7:
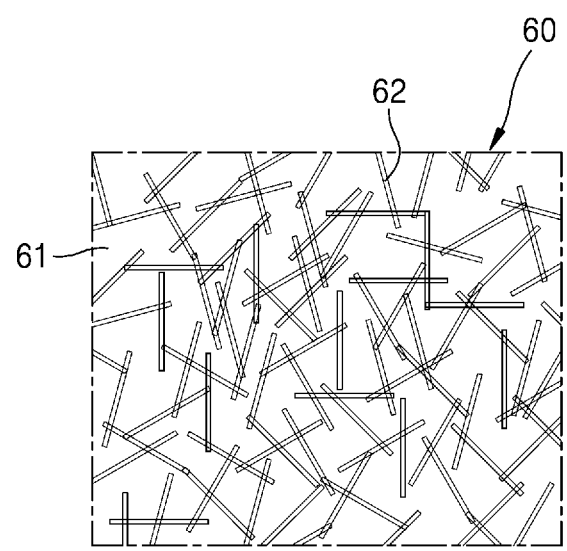
FIG. 7 is a cross-sectional view schematically illustrating a lateral light-shielding layer in FIG. 5.

As shown in FIG. 7 that is a cross-section schematically illustrating the lateral light-shielding layer 60 of FIG. 5, the lateral light-shielding layer 60 may include a resin layer 61 and conductive particles 62. As the resin layer 61, any material having excellent dispersion properties for the conductive particles 62 may be used. In an embodiment, the resin layer 61 may include polymer resin, such as acryl-based resin, imide-based resin, epoxy-based resin, BCB, or HMDSO, for example.

The conductive particles 62 may be provided in plural number, and the conductive particles 62 may be arranged to be dispersed in the resin layer 61. The conductive particles 62 may include at least one of Ag, Cu, graphene, Au, and Pt.

The conductive particles 62 may have a form, such as wires, rods, or tubes. That is, the conductive particles 62 may constitute wires, rods, or tubes. In an embodiment, the conductive particles 62 may have a wire shape, as shown in FIG. 7, for example. However, the disclosure is not limited thereto. In an embodiment, the conductive particles 62 may have a shape of a polygonal prism, such as a cube, a quadrangular (e.g., rectangular) parallelepiped, or a hexagonal prism, or may have a shape extending in one direction and having an outer surface partially inclined, for example. In an embodiment, the conductive particles 62 may be a nano wire including Ag, for example. Accordingly, even when the conductive particles 62 are dispersed in the resin layer 61, a portion of conductive particles 62 may contact a portion of adjacent conductive particles 62. Thus, the lateral light-shielding layer 60 may have conductivity due to such conductive particles 62. In other words, the lateral light-shielding layer 60 may be a conductive layer including a conductive material.

In the display apparatus 1, friction may occur between the display apparatus 1 and a user and/or an external object during use. Due to the friction, electric charges may be accumulated in the cover window 20. In other words, electrostatic electricity may be accumulated in the cover window 20. When the electric charges accumulated in the cover window 20 moves to the display panel 10, the display panel 10 may malfunction or be damaged. In other words, due to electrostatic discharge ("ESD"), the display panel 10 may malfunction or be damaged.

However, in the display apparatus 1 in the illustrated embodiment, the display apparatus 1 includes the lateral light-shielding layer 60, and the electric charges accumulated in the cover window 20 may move to the metal plate 30 by the lateral light-shielding layer 60. In an embodiment, the electric charges accumulated in the cover window 20 may move along a surface of the cover window 20, for example. In addition, the electric charges may also move along a surface of the second cover window light-shielding layer 22 covering a part of the cover window 20. Since the second cover window light-shielding layer 22 contacts the lateral light-shielding layer 60 that is a conductive layer, the electric charges may move to the metal plate 30 through the lateral light-shielding layer 60. Accordingly, even when the electric charges are accumulated in the cover window 20, the accumulated electric charges may escape to the metal plate 30 without moving to the display panel 10. Thus, the display panel 10 may not malfunction, and the display panel 10 may not be damaged.

Figure 8:
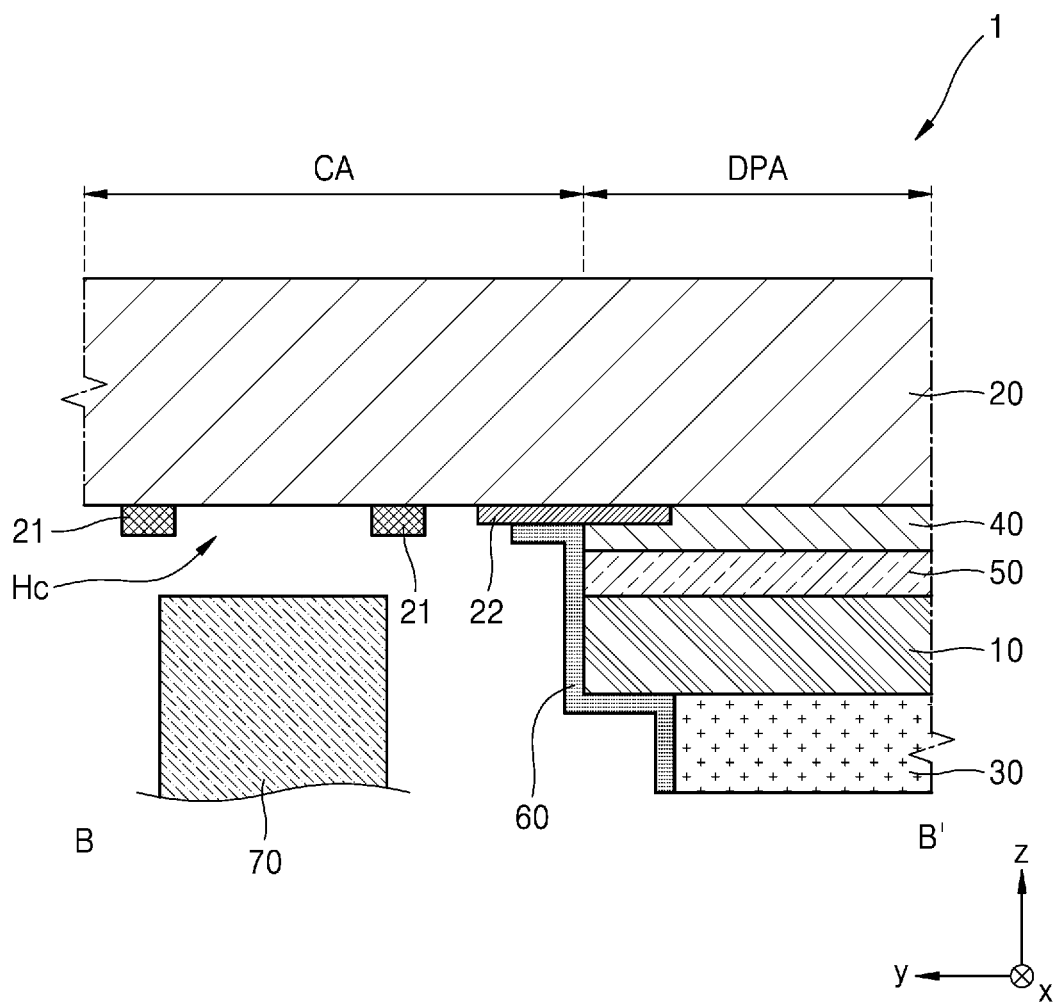
FIG. 8 is a cross-sectional view schematically illustrating an embodiment of a part of a display apparatus.

In FIG. 5, the metal plate 30 has a same or similar area as the display panel 10. However, the disclosure is not limited thereto. In an embodiment, as shown in FIG. 8 that is a cross-sectional view schematically illustrating a part of the display apparatus 1 in an embodiment, the metal plate 30 may have a smaller area than that of the display panel 10, for example. Accordingly, the display panel 10 may be arranged to protrude further than the metal plate 30 in the lateral direction (e.g., a +y direction). In this case, a part of the lateral light-shielding layer 60 may further cover the lower surface (in the −z direction) of the display panel 10. Accordingly, the lateral light-shielding layer 60 may also block light propagating in the direction to the component 70 from the lower surface (in the −z direction) of the display panel 10.

In FIG. 8, only the metal plate 30 has a smaller area than that of the display panel 10. However, the adhesive layer 40 and the optical functional layer 50 may also have a smaller area than that of the display panel 10. Accordingly, the display panel 10 may be arranged to protrude further than the metal plate 30, the adhesive layer 40, and the optical functional layer 50 in the lateral direction (e.g., the +y direction). In this case, a part of the lateral light-shielding layer 60 may further cover an upper surface (in the +z direction) of the display panel 10. Accordingly, the lateral light-shielding layer 60 may also block light propagating in the direction to the component 70 from the upper surface (in the +z direction) of the display panel 10.

Although the display apparatus 1 is described above, the disclosure is not limited thereto. A method of manufacturing the display apparatus 1 described above may also belong to the scope of the disclosure. A method of manufacturing the display apparatus 1 is described below.

Figure 9:
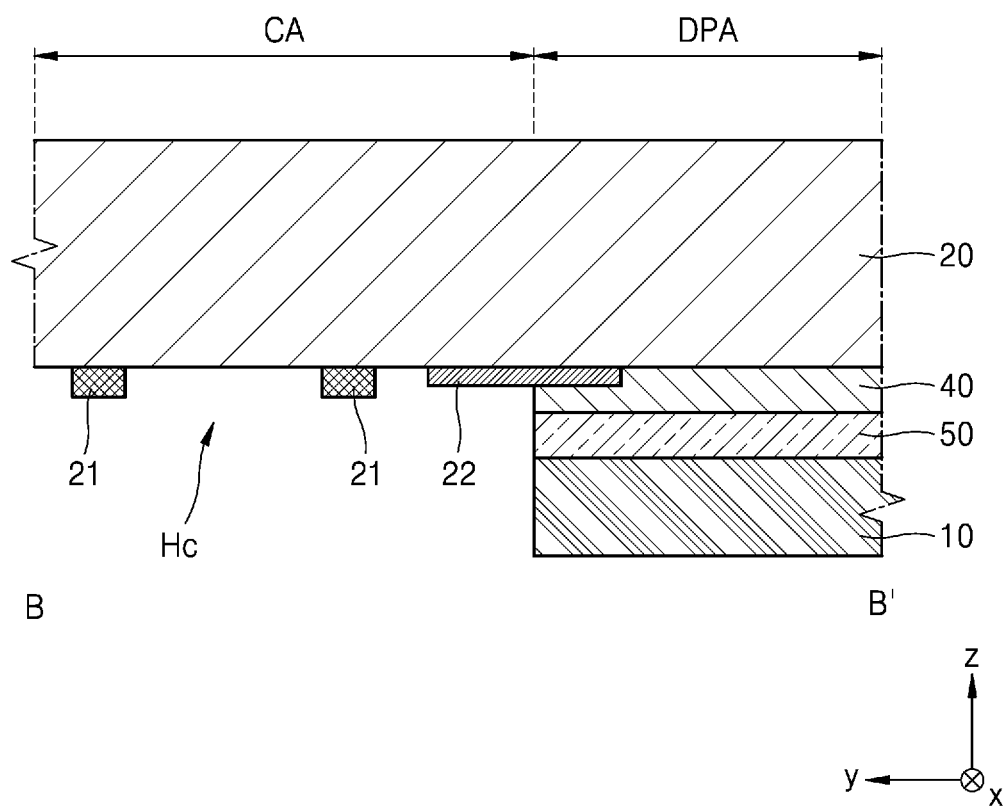
FIGS. 9 to 13 are diagrams illustrating an embodiment of a method of manufacturing a display apparatus.
Figure 11:
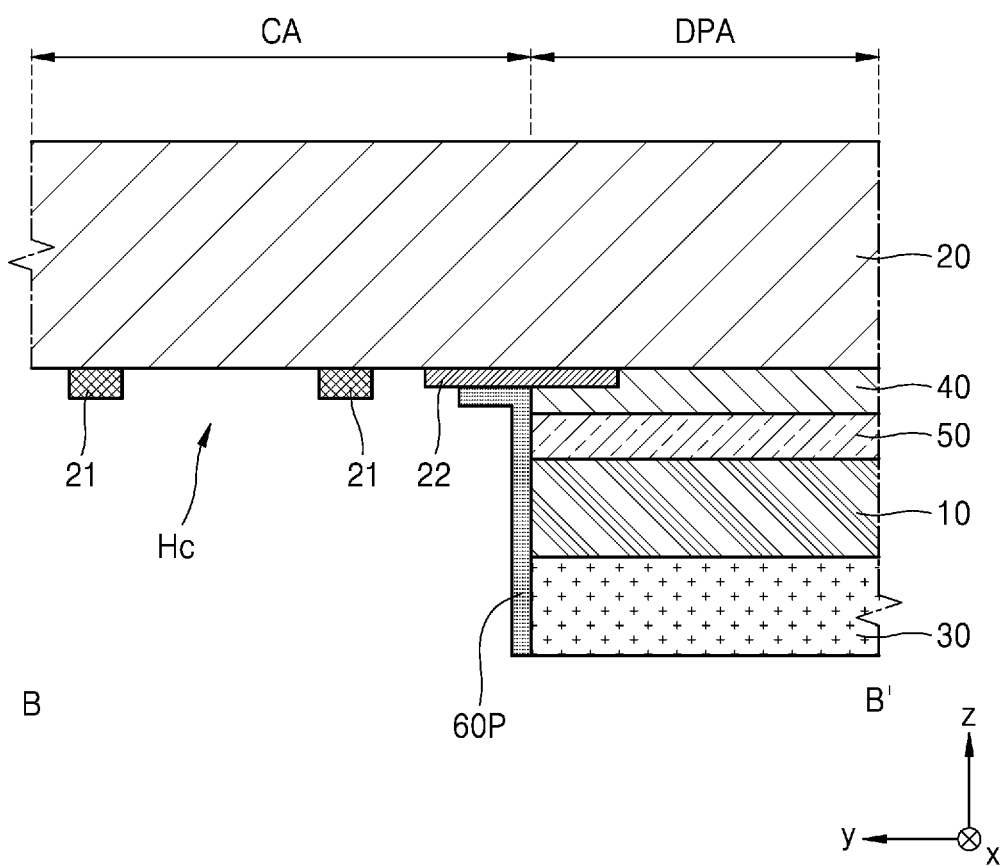
Figure 12:
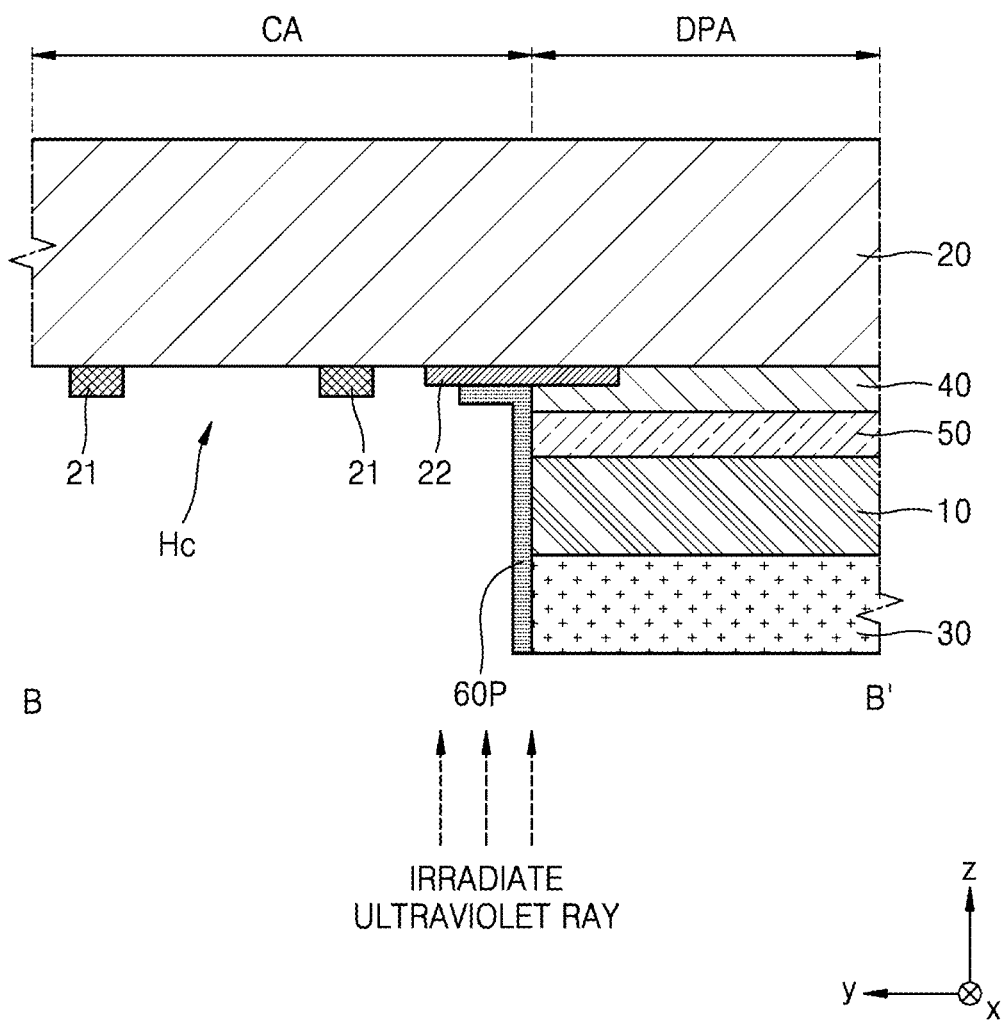
Figure 13:
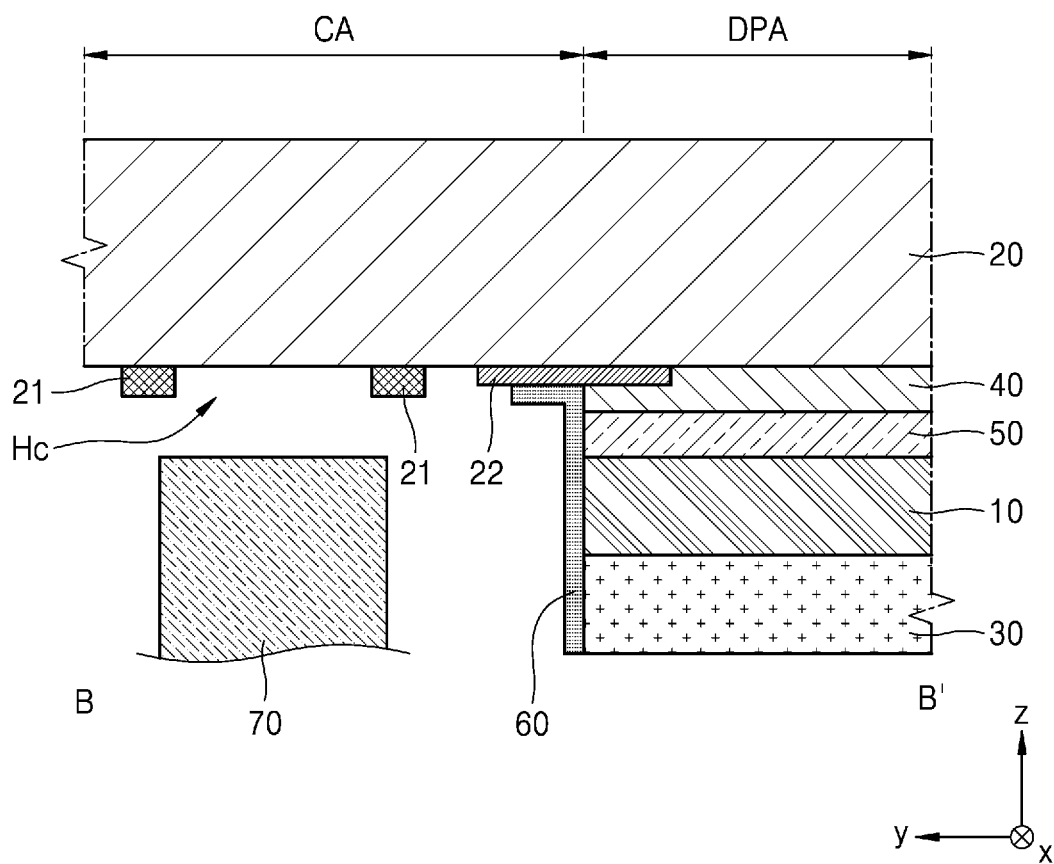

FIGS. 9 to 13 are diagrams illustrating an embodiment of a method of manufacturing the display apparatus 1. In an embodiment, FIGS. 9 and 13 are cross-sectional views schematically illustrating a process of forming the lateral light-shielding layer 60, for example. By the method of manufacturing the display apparatus, the display apparatus 1 described above with reference to FIGS. 1 to 8 may be manufactured. Hereinafter, for convenience, descriptions that are already provided above with reference to FIGS. 1 to 8 are omitted.

First, as shown in FIG. 9, the cover window 20 may be attached over the display panel 10. In an embodiment, the optical functional layer 50 may be attached onto the display panel 10, and the adhesive layer 40 may be attached under the cover window 20, for example. In other words, by attaching the adhesive layer 40 attached under the cover window 20 onto the optical functional layer 50 attached onto the display panel 10, the cover window 20 may be attached over the display panel 10.

The display panel 10 may include the substrate 100, the circuit layer 200, the display element layer 300, and the encapsulation layer 400. In an embodiment, the circuit layer 200 may be disposed on the substrate 100, the display element layer 300 may be disposed on the circuit layer 200, and the encapsulation layer 400 may be disposed on the display element layer 300, for example.

The circuit layer 200 may include a transistor TFT, an inorganic insulating layer IIL, and an organic insulating layer OL. The transistor TFT may include a semiconductor layer Act, a gate electrode GE, a source electrode SE, and a drain electrode DE. The inorganic insulating layer IL may include a gate insulating layer IIL1, a first inter-insulating layer IIL2, and a second inter-insulating layer IIL3. The display element layer 300 may include a display element 310 and a pixel-defining layer 320. In an embodiment, the display element 310 may be an organic light-emitting diode including a pixel electrode 311, an opposite electrode 313, and an intermediate layer 312, the intermediate layer 312 being interposed between the pixel electrode 311 and the opposite electrode 313 and including an emission layer, for example. The pixel electrode 311 of the display element 310 may be electrically connected to the transistor TFT by being electrically connected to the source electrode SE or the drain electrode DE of the transistor TFT.

The encapsulation layer 400 may include a first inorganic encapsulation layer 410, an organic encapsulation layer 420, and a second inorganic encapsulation layer 430. Since the encapsulation layer 400 covers the display element 310, the display element 310 may be protected from external moisture, oxygen, or the like.

The first cover window light-shielding layer 21 and the second cover window light-shielding layer 22 may be disposed under the cover window 20, the first cover window light-shielding layer 21 including the component hole Hc. The cover window 20 may be attached over the display panel 10 such that the first cover window light-shielding layer 21 does not overlap the display panel 10. As described above, the optical functional layer 50, the adhesive layer 40, and the cover window 20 may be sequentially attached onto the display panel 10, and the first cover window light-shielding layer 21 may not overlap the optical functional layer 50 and the adhesive layer 40, either.

Figure 10:
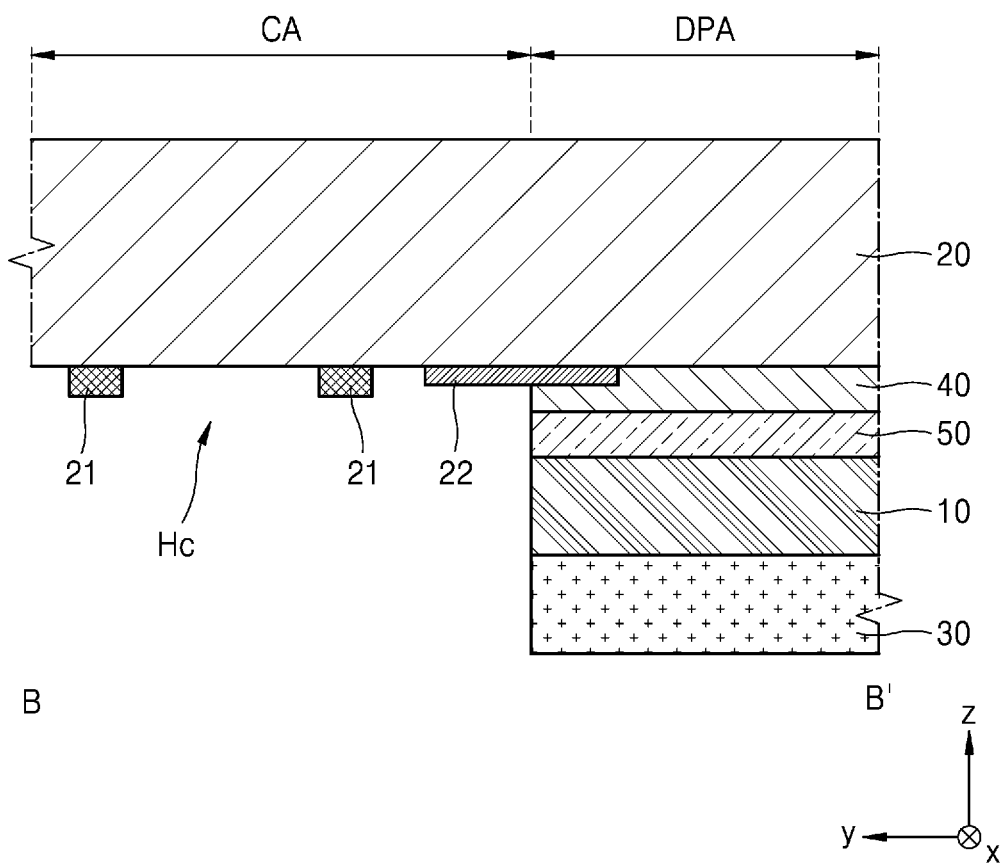

Next, as shown in FIG. 10, the metal plate 30 may be attached under the display panel 10. An adhesive member may be disposed on the metal plate 30. By the adhesive member, the metal plate 30 may be attached under the display panel 10.

Next, as shown in FIG. 11, a preliminary lateral surface light-shielding layer 60P may be formed by inkjet printing a material for forming a lateral surface light-shielding layer, to cover one lateral surface of the display panel 10 adjacent to the component hole Hc. In the disclosure, the "preliminary lateral surface light-shielding layer" may denote a layer to which ultraviolet rays are not irradiated after a material for forming a lateral surface light-shielding layer is applied.

The material for forming the lateral surface light-shielding layer may include a material for forming a resin layer and a conductive particle. The material for forming the resin layer may be cured by light or moisture. In an embodiment, the material for forming the resin layer may include polymer resin, such as acryl-based resin, imide-based resin, epoxy-based resin, BCB, or HMDSO, for example. The conductive particle may include at least one of Ag, Cu, graphene, Au, and Pt.

In an embodiment, when the material for forming the resin layer may be cured by light, the material for forming the lateral surface light-shielding layer may further include a photocuring agent. The photocuring agent may be included as long as the photocuring agent may be used for photocuring the material for forming the resin layer, and is not particularly limited thereto. When the material for forming the resin layer may be cured by moisture, the material for forming the lateral surface light-shielding layer may not further include the photocuring agent. For convenience, it is described below that the material for forming the resin layer may be cured by light.

In an embodiment, the material for forming the lateral surface light-shielding layer may further include a solvent. The solvent included in the material for forming the lateral surface light-shielding layer may be a water-soluble solvent. In other words, the material for forming the lateral surface light-shielding layer may be a solution in which a material for forming a resin layer, conductive particles, and a photocuring agent are dissolved in a solvent.

The preliminary lateral surface light-shielding layer 60P may be formed to contact the metal plate 30 and the cover window 20. In an embodiment, the preliminary lateral surface light-shielding layer 60P may be unitary as a single body to cover a lateral surface of the adhesive layer 40, a lateral surface of the optical functional layer 50, a lateral surface of the display panel 10, a lateral surface of the metal plate 30, and a lower surface (in the −z direction) of the second cover window light-shielding layer 22, for example. In an embodiment, a part of the preliminary lateral surface light-shielding layer 60P may be formed to cover the lateral surface of the adhesive layer 40, the lateral surface of the optical functional layer 50, the lateral surface of the display panel 10, and the lateral surface of the metal plate 30, and another part of the preliminary lateral surface light-shielding layer 60P may be formed to cover the lower surface (in the −z direction) of the second cover window light-shielding layer 22, for example.

Next, as shown in FIG. 12, ultraviolet rays may be irradiated onto the preliminary lateral surface light-shielding layer 60P. Accordingly, the lateral light-shielding layer 60 may be formed. In an embodiment, ultraviolet rays having a light amount of about 100 millijoules per square centimeter (mJ/cm$^2$) to about 1000 mJ/cm$^2$ may be irradiated onto the preliminary lateral surface light-shielding layer 60P, for example. For photocuring, ultraviolet rays having a wavelength of about 300 nanometers (nm) to about 400 nm may be used. An LED or a metal halide may be used as an ultraviolet source. When the ultraviolet rays are irradiated onto the preliminary lateral surface light-shielding layer 60P, the preliminary lateral surface light-shielding layer 60P may be photocured.

Next, as shown in FIG. 13, the component 70 may be disposed under the cover window 20. In an embodiment, the component 70 may be arranged to overlap the component hole Hc included in the first cover window light-shielding layer 21 disposed under the cover window 20, for example.

In an embodiment configured as described above, a display apparatus may be implemented in which malfunction of a component due to light leakage in a lateral direction of a display panel may be prevented and, at the same time, malfunction and damage of the display panel due to static discharge may be prevented. However, the scope of the disclosure is not limited by this effect.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:
   a cover window comprising a display panel area and a component area surrounding the display panel area;
   a display panel on the cover window, in the display panel area, and comprising a display element;
   a metal plate on the display panel;
   a first cover window light-shielding layer which is disposed on the cover window in the component area and in which a component hole is defined;
   a second cover window light-shielding layer on the cover window and adjacent to the display panel; and
   a lateral light-shielding layer covering a lateral surface of the display panel adjacent to the component hole, and contacting the second cover window light-shielding layer.

2. The display apparatus of claim 1, wherein the second cover window light-shielding layer covers the cover window.

3. The display apparatus of claim 1, wherein the lateral light-shielding layer covers a lateral surface of the metal plate and a first surface of the second cover window light-shielding layer opposite to a second surface of the second cover window light-shielding layer facing the cover window.

4. The display apparatus of claim 1, wherein the lateral light-shielding layer extends along the lateral surface of the display panel and surrounds at least a part of the display panel.

5. The display apparatus of claim 1, wherein an optical density of the lateral light-shielding layer is 0.5 to 1.9.

6. The display apparatus of claim 1, wherein the lateral light-shielding layer comprises a resin layer and conductive particles.

7. The display apparatus of claim 6, wherein the conductive particles constitute wires, rods, or tubes.

8. The display apparatus of claim 6, wherein the conductive particles comprise at least one of silver (Ag), copper (Cu), and graphene.

9. The display apparatus of claim 1, further comprising:
   an optical functional layer interposed between the cover window and the display panel; and
   an adhesive layer interposed between the cover window and the optical functional layer,
   wherein the lateral light-shielding layer is unitary as a single body and covers a lateral surface of the adhesive layer, a lateral surface of the optical functional layer, a lateral surface of the display panel, a lateral surface of the metal plate, and a first surface of the second cover window light-shielding layer opposite to a second surface of the second cover window light-shielding layer facing the cover window.

10. The display apparatus of claim 1, further comprising a component overlapping the component hole.

11. A method of manufacturing a display apparatus, the method comprising:
    attaching, over a display panel, a cover window on which a first cover window light-shielding layer and a second cover window light-shielding layer are disposed, such that the display panel comprising a display element and a component hole defined in the first cover window light-shielding layer do not overlap each other in a plan view;
    attaching a metal plate on the display panel; and
    forming a lateral light-shielding layer to cover a lateral surface of the display panel adjacent to the component hole and contact the metal plate and the second cover window light-shielding layer.

12. The method of claim 11, wherein the second cover window light-shielding layer covers the cover window.

13. The method of claim 11, wherein the forming the lateral light-shielding layer comprises forming the lateral light-shielding layer such that the lateral light-shielding layer covers a lateral surface of the metal plate and a first surface of the second cover window light-shielding layer opposite to a second surface of the second cover window light-shielding layer facing the cover window.

14. The method of claim 11, wherein the forming the lateral light-shielding layer comprises forming the lateral light-shielding layer such that the lateral light-shielding layer surrounds at least a part of the display panel.

15. The method of claim 11, wherein the forming the lateral light-shielding layer comprises forming the lateral light-shielding layer such that an optical density of the lateral light-shielding layer is 0.5 to 1.9.

16. The method of claim 11, wherein the forming the lateral light-shielding layer comprises forming the lateral light-shielding layer such that the lateral light-shielding layer comprises a resin layer and conductive particles.

17. The method of claim 16, wherein the forming the lateral light-shielding layer comprises forming the lateral light-shielding layer such that the conductive particles constitute wires, rods, or tubes.

18. The method of claim 16, wherein the forming the lateral light-shielding layer comprises forming the lateral light-shielding layer such that the conductive particles comprise at least one of silver (Ag), copper (Cu), and graphene.

19. The method of claim 11, wherein the attaching the cover window comprises:

attaching an optical functional layer onto the display panel; and attaching an adhesive layer on the cover window, and the forming the lateral light-shielding layer comprises integrally forming the lateral light-shielding layer such that the lateral light-shielding layer covers a lateral surface of the adhesive layer, a lateral surface of the optical functional layer, the lateral surface of the display panel, a lateral surface of the metal plate, and a first surface of the second cover window light-shielding layer opposite to a second surface of the second cover window light-shielding layer facing the cover window.

20. The method of claim 11, further comprising arranging a component to overlap the component hole.

* * * * *